Figure 1:
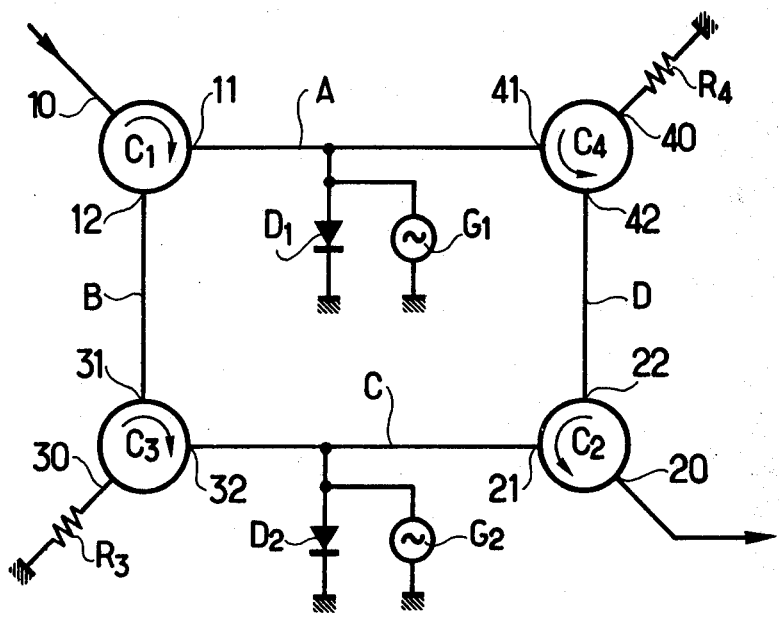

United States Patent [19]

Chapnikoff

[11] 4,004,255
[45] Jan. 18, 1977

[54] MICROWAVE FREQUENCY PHASE MODULATOR

[75] Inventor: Roland Chapnikoff, Orsay, France

[73] Assignee: Compagnie Industrielle des Telecommunications Cit-Alcatel, Paris, France

[22] Filed: July 2, 1975

[21] Appl. No.: 592,511

[30] Foreign Application Priority Data

July 25, 1974 France .................. 74.25934

[52] U.S. Cl. .............. 333/31 R; 332/23 R; 333/29; 333/1.1; 333/7 D
[51] Int. Cl.² ............ H01P 1/18; H01P 1/38; H03C 7/02; H03C 3/22
[58] Field of Search ........ 333/1.1, 7 D, 31 R, 333/31 A; 332/16 R, 9 R, 16 T, 18, 22 R, 23 A, 24, 29 R, 30 R, 30 V; 325/45, 47, 125, 126, 145

[56] References Cited

UNITED STATES PATENTS

| 3,136,950 | 6/1964 | Mackey | 333/1.1 X |
| 3,349,342 | 10/1967 | Garver | 332/9 |
| 3,506,930 | 4/1970 | Gantick | 332/16 R |
| 3,656,069 | 4/1972 | Beccone et al. | 332/16 R |
| 3,798,573 | 3/1974 | Seidel | 325/145 X |

Primary Examiner—Alfred E. Smith
Assistant Examiner—Marvin Nussbaum
Attorney, Agent, or Firm—Roland Plottel

[57] ABSTRACT

Phase modulator enabling the ratio of parasitic waves to be reduced and the precision on the phase shift to be increased, comprising two microwave frequency diodes connected to voltage supplies such that the diodes are each rendered conductive or blocked in phase opposition with one another, the two diodes being respectively arranged in two paths having different electrical lengths for ensuring the phase shift, and two or four circulators enabling the main waves to issue at the output of the modulator and the parasitic waves to be dissipated in matching loads.

3 Claims, 2 Drawing Figures

MICROWAVE FREQUENCY PHASE MODULATOR

The present invention relates to a diode phase modulator making use of circulators and more particularly to a phase modulator adapted to effect phase shifting at microwave frequencies.

As is known, phase shift of a wave may be brought about by means of a microwave frequency diode positively or negatively polarized so as to present respectively a zero or infinite impedance. If such a diode is mounted in a wave guide at a distance 1 from a close and producing a short circuit, the other end being connected to one access of a three-access circulator, one of the other two accesses being for incoming energy and the other for outgoing energy, the last-named is modulated as it leaves the circulator. In fact, when the diode offers zero impedance relatively to ground the incident wave is reflected without phase shift. When the diode offers infinite impedance relatively to ground, the wave is propagated as far as the short circuit, is then reflected and the phase shift of the reflected wave will depend on the outward and return paths corresponding to the distance 1, say, $4\pi 1/\lambda$. If $1 = \lambda/4$ for example, the phase shift will be 180°. In this example, in the case of a positively polarized diode, the outgoing wave will be in phase with the incident wave; in the case of a negatively polarized diode the outgoing wave will be in phase opposition with the incident wave.

The main disadvantage of the system resides in the fact that at frequencies of the order of 30 to 60 GHz, the diodes do not behave ideally as purely reactive circuits but have in each state a resistance which will dissipate some of the energy and will degrade the effective phase shift function. Particularly in the case or state where the impedance should be zero, this is not so in practice and a part of the incident energy is not reflected by the diode but is propagated as far as the short circuit, being finally recombined with the reflected wave by the diode. Similarly, the diode offers a finite resistance although its state should be that of infinite impedance. The reflected wave formed in the two cases has no well-defined phase relationship owing to the presence of parasitic oscillations capable of attaining a level of 10 dB as compared with the level of the principal wave. Moreover, the diode losses, by dissipation, in its two states are generally different, which can be a great nuisance.

A phase modulator with two mutually oppositely polarized diodes is also known (see for example IBM Tec. Dis. Bull vol. 7, No. 9, 1965, page 747), in which provision is made to divide the energy at the access to two paths of different lengths, the partial waves being recombined at the outlet in such a manner as to cancel out the carrier frequency. In a modulator of this kind, the parasitic signals due to the imperfections of the diodes are propagated along all the channels, and it appears impossible to balance them out at the output.

The present invention seeks to obviate these drawbacks. In the modulator according to the invention, the ratio of parasitic waves is reduced, the diode losses, in each state, are compensated, and the power applied to the device (180° modulator) may be twice as great as in the case of a conventional modulator.

According to the present invention, there is provided a microwave phase modulator comprising first and second three-access circulators, the first accesses of the first and second circulators serving, respectively, as the input and the output access of the modulator, the second accesses being connected to one another by way of a first path having a first diode arranged therein and the third accesses being connected to one another by way of a second path having a second diode arranged therein, the two paths being of different electrical length and the two diodes being connectible to voltage supplies such that they may each be rendered conductive or blocked in phase opposition with one another.

Preferably, each path includes a respective further circulator, of which one access is terminated in a matching load and the other two are connected in the said path.

Figure 2:
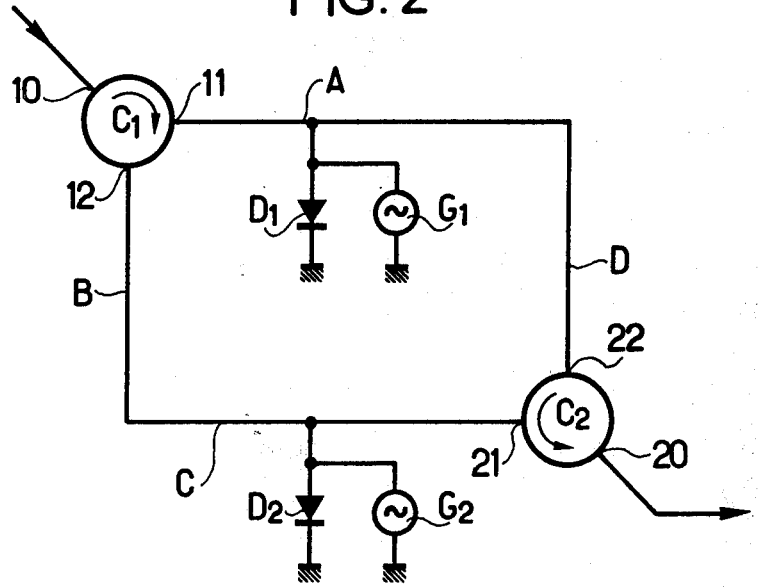

The invention will be described by way of an example with reference to the accompanying drawings, in which:

FIG. 1 shows a diagram of the circuit of a phase modulator with four circulators according to the invention, FIG. 2 shows a diagram of the circuit of a phase modulator with two circulators according to the invention.

In these two figures, like members are designated by like reference letters and numerals.

As will be seen from FIG. 1, four wave guides A, B, C, D are interconnected through junction circulators $C_1, C_2, C_3, C_4$ having respective connections 10, 11, 12; 20, 21, 22; 30, 31, 32; 40, 41, 42. The connection 10 serves for the access of the incident electromagnetic energy (from 30 to 60 GHz). The connection 20 is for taking off the energy output. The circulators are known per se, and enable a wave arriving at one connection to be transferred to an adjacent connection, in the direction of the arrow. A microwave frequency diode $D_1$ is mounted within the guide A and a generator $G_1$ is mounted outside, said generator being connected through an orifice in the guide wall to an electrode of the diode $D_1$. Similarly a diode $D_2$ and its generator $G_2$ are associated with the wave guide C. The connection 30 of the circulator $C_3$ terminates in a matched load $R_3$ installed at the end of the wave guide connected to terminal 30. Similarly the connection 40 of the circulator $C_4$ is linked to a waveguide terminated by a resistive load $R_4$. The generator $G_1$ and $G_2$ are synchronized in such a way that while one emits a positive pulse, the other emits a negative pulse and vice versa. The guides B and D present an electrical path of different length depending on the phase shift required. For example if B is of length 1 the guide D may have a length $1+\lambda/2$ ($\lambda$ being the wave-length of the incident electromagnetic wave) so as to achieve a phase shift or phase reversal of 180°. It is likewise possible to have two guides B and D of exactly identical length, but to insert a phase-shifter in the guide D for example, thus introducing the required phase shift.

The mode of functioning is as follows:

At a given instant, the diodes $D_1$ and $D_2$ are polarized in such a way that $D_1$ is in the state of zero impedance say, $D_1(1)$ and $D_2$ is in the state of infinite impedance say $D_2(0)$. The incident energy arriving by the connection 10 of the circulator $C_1$ follows the direction of the arrow, leaves by the connection 11, proceeds along the guide A and is reflected by the diode $D_1$ which is in the $D_1(1)$ state. The energy reaches the connection 11 and passes through the circulator in the direction of the arrow, leaves at 12, passes along the guide B, then through $C_3$ from 31 to 32, is not stopped by the diode $D_2$ which is in the $D_2(0)$ state, reaches the connection 21, passes around the circulator $C_2$ in the direction of the arrow and issues at 20.

At a following instant, the diode $D_1$ is in the state of infinite impedance say $D_1(0)$ and the diode $D_2$ is in the state of zero impedance say $D_2(1)$. The incident energy arriving at the circulator $C_1$ through the connection 10, leaves at connection 11, passes through the diode $D_1$ which is in the $D_1(0)$ state, enters through connection 41, leaves through connection 42, travels down the guide D, enters through connection 22, leaves through connection 21, is reflected by diode $D_2$ in the $D_2(1)$ state, returns to the connection 21, traverses the circulator in the direction of the arrow and issues at the output 20.

The phase shift is produced at the output 20 by the difference in the paths and especially by the difference in length between the guides B and D or by the presence in the guide D of a differential phase shifter.

In the $D_1(1)$ and $D_2(0)$ states, parasitic oscillations are set up which pass through $D_1$ towards $C_4$ at an attenuated level which may be 10 dB below that of the incident wave. These parasitic oscillations follow the path 41, 42, D, 22, 21, C, $D_2(0)$, 32, 30 to be dissipated in the load $R_3$.

On passing through diode $D_2$ which is in the $D_2(0)$ state, some of the parasitic oscillations are reflected, for example with an attenuation of 10 dB thus returning to 21 and issuing at 20. The result is that the parasitic oscillations are attenuated down to a level of 10 dB + 10 dB, say 20 dB, in relation to the incident wave. The parasitic oscillations appearing at output 20 and capable of disturbing the effective functioning of the apparatus are considerably reduced as compared with prior art circuits.

In the $D_1(0)$ and $D_2(1)$ states parasitic oscillations likewise arise, being reflected by $D_1(0)$, returning to $C_1$, and following the path 12, B, 31, 32, $D_2$, being reflected by the latter in the $D_2(1)$ state and returning via 32, 30 to be dissipated in the load $R_3$. A part only of the parasitic oscillation passes through $D_2(1)$, regains $C_2$ and issues at output 20 to reinforce the main wave of the modulator. The same reason as before allows the conclusion that the parasitic oscillations are considerably attenuated.

As a further advantage it may be confirmed that the losses are equal in the two states since the two diodes $D_1$ and $D_2$ function in reverse modulation and the circuits traversed by the incident wave are, except for phase shift, substantially identical in each state. Moreover, the losses of the circuit remain of the same order as those of a conventional 180° modulator using a single diode.

An additional advantage arises from the fact that it is possible to apply to each diode a power twice as great as in the conventional case of a 180° modulator.

A simplified variant using two circulators $C_1$ and $C_2$ is shown in FIG. 2. The mode of functioning is the same as previously as regards the paths traversed by the principal wave. With respect to the parasitic oscillations, the absence of the circulator $C_3$ and its matched load causes dissipation of the parasitic oscillation in the feed circuit upstream of the connection 10. This simplified layout enables two circulators to be saved together with the losses associated therewith but the standing wave ratio measured at the circuit input is higher than with the four circulators and resonance phenomena frequently arising in closed loops may also exist.

The diode phase modulator forming the subject of the invention enables the ratio of parasitic oscillations to be reduced and may be used whenever it is desired to use high power and to achieve an accurate phase shift.

The invention is applicable in the field of wave guides in the 30 to 60 GHz frequency band.

What is claimed is:

1. A microwave phase modulator comprising first and second three-access circulators, the first accesses of the first and second circulators serving, respectively, as the input and the output access of the modulator, the second accesses being connected to one another by way of a first path having a first diode arranged therein and the third accesses being connected to one another by way of a second path having a second diode arranged therein, the two paths being of different electrical length and the two diodes being connected to voltage supplies such that they are each rendered conductive or blocked in phase opposition with each other.

2. A modulator as claimed in claim 1, in which each path includes a respective further circulator comprising three accesses, of which one access is terminated in a matching load and the other two accesses are connected in each said path.

3. A modulator as claimed in claim 1, in which the second path includes a differential phase shifter.

* * * * *